(12) United States Patent
Pi-Hui

(10) Patent No.: US 7,701,233 B2
(45) Date of Patent: Apr. 20, 2010

(54) HEAT-RESISTANT LENS KIT

(75) Inventor: Tai Pi-Hui, Hsin-Chu (TW)

(73) Assignee: King Yuan Electronics Co., Ltd., Hsin-Chu (TW)

(*) Notice: Subject to any disclaimer, the term of this patent is extended or adjusted under 35 U.S.C. 154(b) by 0 days.

(21) Appl. No.: 11/819,083

(22) Filed: Jun. 25, 2007

(65) Prior Publication Data
US 2008/0211527 A1   Sep. 4, 2008

(30) Foreign Application Priority Data
Mar. 2, 2007   (TW) .............................. 96107169 A

(51) Int. Cl.
G01R 31/02   (2006.01)
(52) U.S. Cl. ..................................... 324/754
(58) Field of Classification Search .................. None
See application file for complete search history.

(56) References Cited

U.S. PATENT DOCUMENTS

| 4,115,736 | A | * | 9/1978 | Tracy | 324/760 |
| 4,518,914 | A | * | 5/1985 | Okubo et al. | 324/762 |
| 5,835,997 | A | * | 11/1998 | Yassine | 324/754 |
| 6,771,086 | B2 | * | 8/2004 | Lutz et al. | 324/760 |
| 7,102,159 | B2 | * | 9/2006 | Tsai et al. | 257/53 |
| 2005/0237418 | A1 | * | 10/2005 | Sakamoto | 348/340 |
| 2006/0214673 | A1 | * | 9/2006 | Tamai | 324/753 |
| 2006/0245071 | A1 | * | 11/2006 | George et al. | 359/665 |

* cited by examiner

Primary Examiner—Ha Tran T Nguyen
Assistant Examiner—Roberto Velez
(74) Attorney, Agent, or Firm—Ming Chow; Sinorica, LLC

(57) ABSTRACT

A heat-resistant lens kit configured within the pogo tower of the wafer tester is disclosed. The heat-resistant lens kit has two parallel lenses and a main body with a through hole. The main body and two parallel lenses enclose a vacuum room within the through hole.

6 Claims, 3 Drawing Sheets

HEAT-RESISTANT LENS KIT

BACKGROUND OF THE INVENTION

1. Field of the Invention

The present invention is related to a wafer tester for a photo sensor, and particularly to a wafer tester that includes a heat-resistant lens kit to form an enclosed room for isolating the surface of a device under test.

2. Description of the Related Art

It is necessary for a CMOS sensor to be tested under low-temperature environment for sure of practical work in the low-temperature environment.

FIG. 1 is a schematic diagram of a wafer tester 10 having a test base 11 as an upper portion and a chuck 13 for loading a device under test as a bottom portion. The test base 11 includes a pogo tower 13, a probe card 14 and a test head 16. The test head 16 is associated with a test probe 18 for touching a device under test, a room for light transmission and a probe card holder 17 for connecting the pogo tower 12 and the probe card 14 into a piece. Obviously, there is a hole individually in the pogo tower 12, probe card 14 and a test head 16 for passing light onto the device under test. Shown in FIG. 1, in order to maintain a device in a low-temperature state, the device under test is necessarily attached to the chuck 13 through low-temperature treatment for sure of low temperature. Meanwhile, the probe card 14 of the wafer tester 10 is close to the device under test in low-temperature state. However, the device under test is in low-temperature state on one hand. On the other hand, the probe card 14 is in room-temperature or higher-temperature state. Thus, there is vapor, also called as saturated vapor, formed on the interface of the low-temperature surface and the high-temperature surface. When light is incident continuously, light though vapor may be reflected, refracted or scattered. Thus, light incident on the device under test may be disordered and further cause incorrect measurement and short to damage the apparatus. Thus, in order to correctly and rapidly test the device under test, the vapor generation should be overcome.

SUMMARY OF THE INVENTION

In order to test a photo sensor in low-temperature state, one object of the present invention is to provide a heat-resistant lens kit to prevent from vapor generation.

Another one object of the present invention provides a heat-resistant lens kit having a main body with a through hole and two parallel lenses to enclose a room. The main body is associated with a suction hole and an indicator to make the room vacuum.

The other object of the present invention provides a wafer tester of photo sensor. The wafer tester includes a heat-resistant lens kit to form a vacuum room for isolating the surface of a device under test from the incident surface of light and preventing from vapor formation.

Another object of the present invention provides a wafer tester of photo sensor which includes a pair of lenses directly attached to the two ends of an opening on a pogo tower to form an enclosed room. A vacuum pump maintains the enclosed room in vacuum state. The low-temperature surface and the room-temperature surface are isolated from each other to prevent vapor formation.

DETAILED DESCRIPTION OF THE PREFERRED EMBODIMENT

The present invention provides a wafer tester. Following illustrations describe detailed components and steps for understanding the present invention. Obviously, the present invention is not limited to the embodiments of wafer tester, however, the preferable embodiments of the present invention are illustrated as followings. Besides, the present invention may be applied to other embodiments, not limited to ones mentioned.

In a known technology, the device under test would be maintained in a low-temperature state when attached to a low-temperature chuck 13. However, the room-temperature probe card 14 causes vapor formation on the interface. The vapor film result in the reflection and fraction of lights and further in test error and apparatus damage. One best resolution to such a problem is to isolate the interface of objects in different temperature with a room in a vacuum state.

Figure 1:
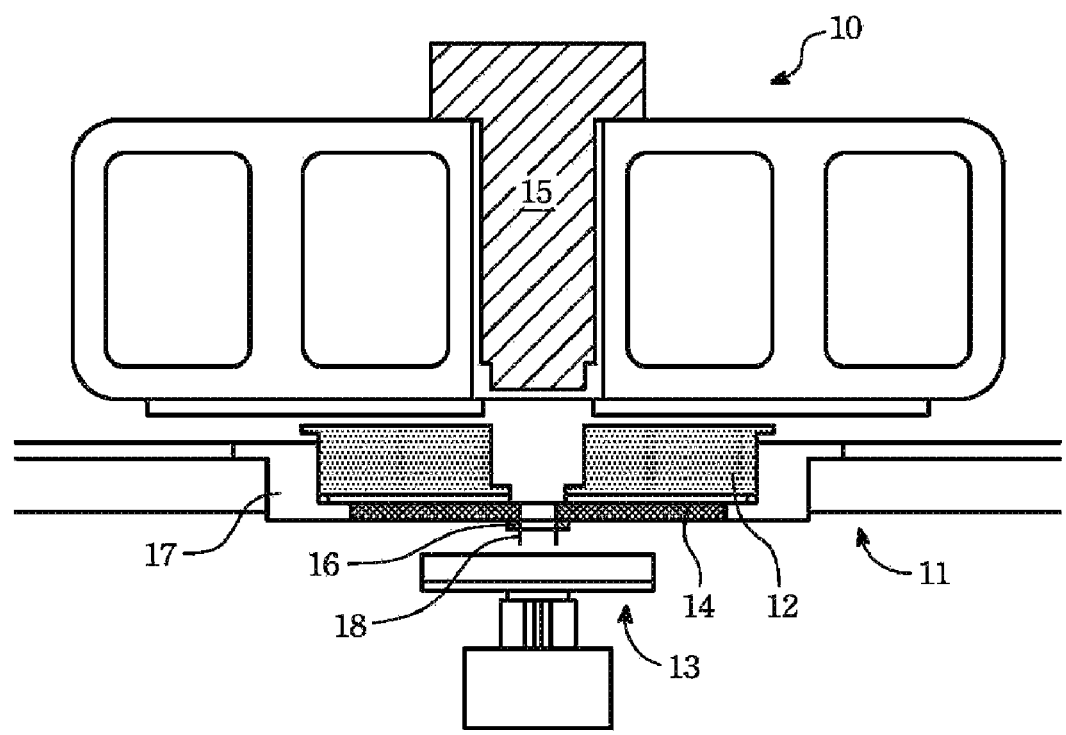
FIG. 1 is a schematic diagram illustrating a testing apparatus according to a prior art.
Figure 2A:
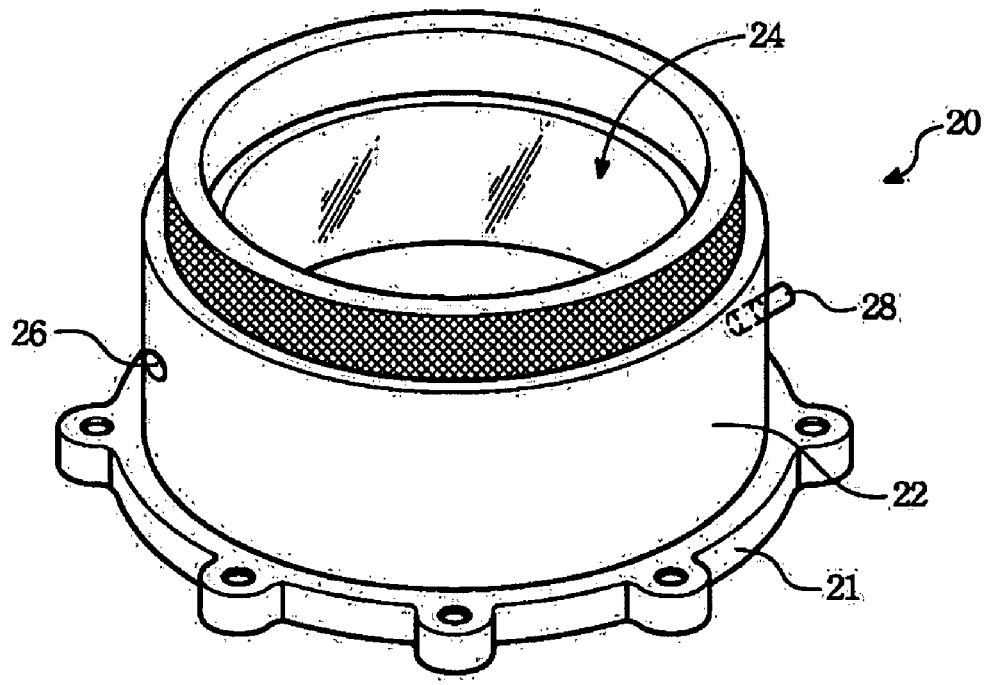
FIG. 2A is a schematic diagram illustrating a heat-resistant lens kit according to the present invention.

Accordingly, one exemplary embodiment of the present invention provides a heat-resistant lens kit 20 shown as FIG. 2A including a main body 22 and two lenses 24. A through hole is set in the main body 22 and the two lenses 24 are parallel configured on the two ends of the through hole of the main body 22. The main body 22 and the two lenses 24 enclose a vacuum room. The two lenses 24 are fixed on the main body 22 with built-in screws or adhesive, and so on. Furthermore, the main body 22 may be made of low thermoconductivity and heat resistant materials to form a heat resistant element in good quality.

In a preferred embodiment, the enclosed room between the main body 22 and two lenses 24 is kept vacuum to be configured for blocking heat conduction. However, in another embodiment, the main body 22 and the two lenses 24 may enclose a non-vacuum room. Gas in the non-vacuum room may be exhaust out to meet vacuum requirement for blocking heat conduction.

The method for making vacuum is not limited to in the present invention. For example, in FIG. 2A, the heat-resistant lens kit 20 includes a suction hole 26 and an indicator 28 to exhaust gas out of the heat-resistant lens kit 20 by an air extractor (not shown). When a vacuum degree is read out within the heat-resistant lens kit 20, the indicator 28 may be sucked into the heat-resistant lens kit 20. Reversely, the indicator 28 may float up to remind a user of extracting gas within the heat-resistant lens kit 20 when the vacuum degree is below a threshold in the heat-resistant lens kit 20. Accordingly, the indicator 28 may be made of spring, elastic sheet, sponge or any suitable elastic element. When a low-temperature environment, for example, room temperature down to −100°, is configured by a chuck 13, vapor due to temperature difference does not result because the enclosed vacuum room by the heat-resistant lens kit 20 may isolate the contact surface of a device under test from incident surface of a probe card 14. Moreover, in order to maintain identical phase of light when light reaches to the element in a test, it is necessary to make the two lenses 24 parallel for fear of interference on light source in the test.

Figure 2B:
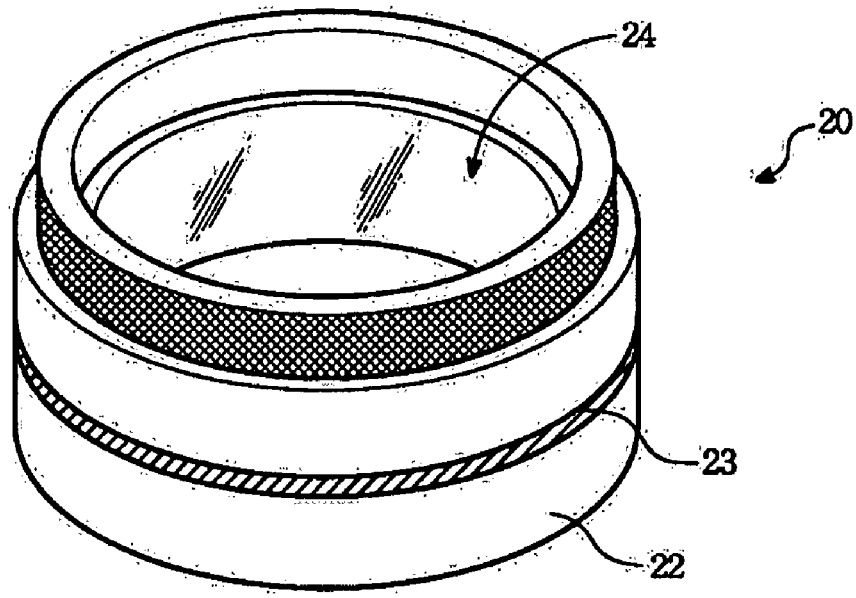
FIG. 2B is a schematic diagram illustrating a heat-resistant lens kit according to the present invention.
Figure 3:
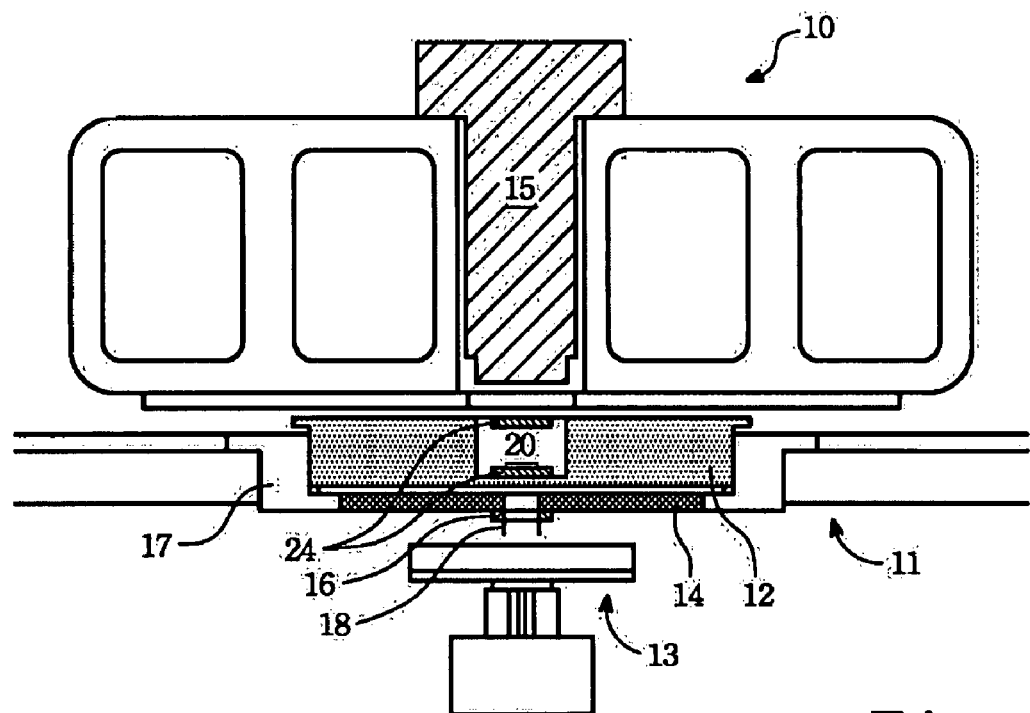
FIG. 3 is a schematic diagram illustrating an exemplary testing apparatus according to the present invention.

Next, shown in FIG. 3 is a schematic diagram illustrating the combination of the heat-resistant lens kit 20 and a wafer tester 10 in accordance with the present invention. The upper portion is a test plate 11 and the lower portion is the wafer tester 10 for loading a device under test. The test plate 11 includes a POGO Tower 12, a probe card 14, a chamber 15 and a test head 16. There are a plurality of test probes 18 for contacting the device under test and a probe card holder 17 for combining the POGO Tower 12 and the probe card 14. There is an opening in the POGO Tower 12 to load the heat-resistant lens kit 20. The fixing of the heat-resistant lens kit 20 and POGO Tower 12 may be implemented with a screw 21, shown in FIG. 2A. Moreover, the heat-resistant lens kit 20 may be fixed on the POGO Tower 12 with at least one O-ring 23 on the main body 22 of the heat-resistant lens kit 20, shown in FIG. 2B. Thus when the light source emits light through the chamber 15 of the wafer tester 10, the light is incident into the opening of the POGO Tower 12 the through the two lenses 24 of the heat-resistant lens kit 20 and the enclosed room, the probe card 14 and the aperture on the test head 16 in sequence, and then on the device under test. The low temperature conducted by the device under test may be isolated and prevent the probe card 14 from vapor.

Figure 4:
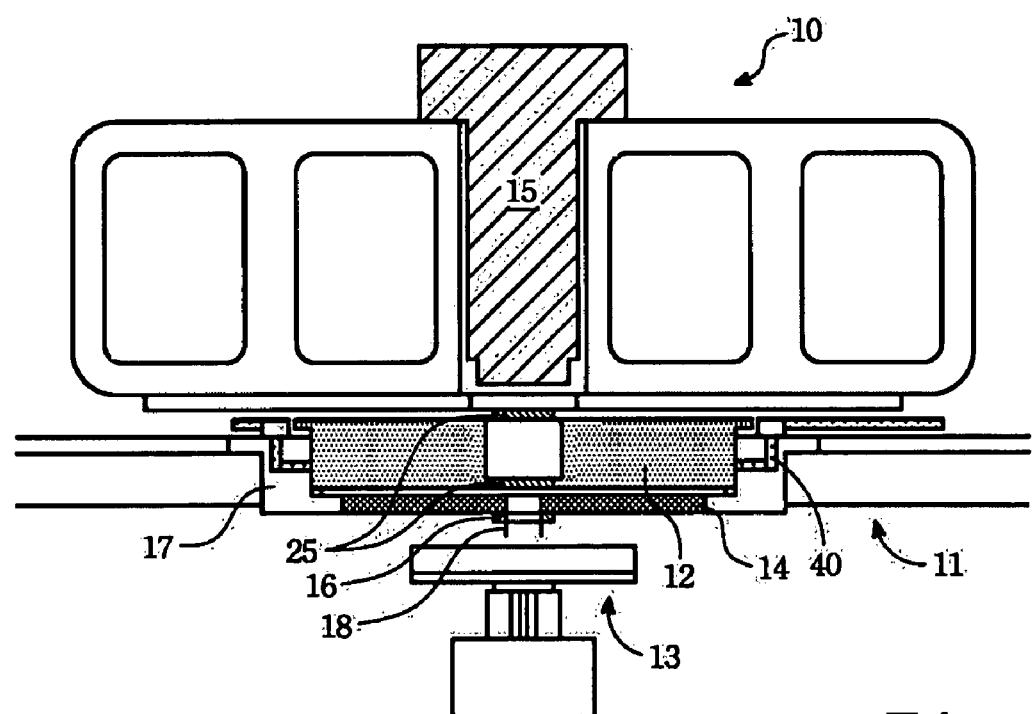
FIG. 4 is a schematic diagram illustrating an exemplary testing apparatus according to the present invention.

In another embodiment of the present invention, the two lenses 25 are directly fixed on the through hole of the chuck 13, shown as FIG. 4. The fixation of the two lenses 25 and the two ends of the POGO Tower 12 is not limited, such as screw fixation, O-ring fixation or direct attachment as long as the fixed two lenses 25 are parallel and in vacuum state. In the embodiment, the vacuum formation is implemented by the vacuum pump 40 on the wafer tester 10 that may associate with the usage condition to maintain vacuum between the two lenses 25 and the POGO Tower 12. Thus, the low temperature conducted by the device under test may be isolated and prevent the probe card 14 from vapor.

Obviously, according to the illustration of embodiments aforementioned, there may be modification and differences in the present invention. Thus it is necessary to understand the addition of claims. In addition of detailed illustration aforementioned, the present invention may be broadly applied to other embodiments. Although the present invention has been explained in relation to its preferred embodiment, it is to be understood that other modifications and variation can be made without departing the spirit and scope of the invention as hereafter claimed.

What is claimed is:

1. A testing apparatus of light-sensing element, comprising:
   a probe card associated with a probe head thereon, wherein there are a plurality of testing probes on the probe head;
   a pogo tower connected with the probe card and having an opening;
   a holder of probe card arranged between the pogo tower and the probe card and configured for connecting the pogo tower and the probe card into a piece;
   a suction device configured on the probe card;
   a chuck configured for loading a device under test; and
   a heat-resistant lens kit, having a main body with a through hole and two parallel lenses configured on two ends of the opening of the pogo tower to form an enclosed vacuum room, and a suction hole and an indicator associated on the main body and the two parallel lenses.

2. The testing apparatus of light-sensing element according to claim 1, wherein the two parallel lenses are directly adhesive onto the pogo tower.

3. The testing apparatus of light-sensing element according to claim 1, wherein the two parallel lenses are fixed to the pogo tower with a screw.

4. The testing apparatus of light-sensing element according to claim 1, wherein the two parallel lenses are fixed to the pogo tower with an O-ring.

5. The testing apparatus of light-sensing element according to claim 3, wherein the chuck provides an environment below negative 40 degree Celsius.

6. The testing apparatus of light-sensing element according to claim 1, wherein the chuck provides an environment below room temperature.

* * * * *